US012789447B2

(12) United States Patent
Gruber

(10) Patent No.: US 12,789,447 B2
(45) Date of Patent: Nov. 10, 2026

(54) METHOD AND APPARATUS FOR LITHOGRAPHY-BASED GENERATIVE MANUFACTURING OF A THREE-DIMENSIONAL COMPONENT

(71) Applicant: UPNANO GMBH, Vienna (AT)

(72) Inventor: Peter Gruber, Vienna (AT)

(73) Assignee: UPNANO GMBH, Vienna (AT)

( * ) Notice: Subject to any disclaimer, the term of this patent is extended or adjusted under 35 U.S.C. 154(b) by 1077 days.

(21) Appl. No.: 17/913,389

(22) PCT Filed: Mar. 18, 2021

(86) PCT No.: PCT/IB2021/052284
§ 371 (c)(1),
(2) Date: Sep. 21, 2022

(87) PCT Pub. No.: WO2021/198835
PCT Pub. Date: Oct. 7, 2021

(65) Prior Publication Data
US 2023/0150190 A1 May 18, 2023

(30) Foreign Application Priority Data
Mar. 31, 2020 (EP) .................................... 20020142

(51) Int. Cl.
*B29C 64/135* (2017.01)
*B29C 64/264* (2017.01)
(Continued)

(52) U.S. Cl.
CPC .......... *B29C 64/135* (2017.08); *B29C 64/264* (2017.08); *G03F 7/0037* (2013.01);
(Continued)

(58) Field of Classification Search
CPC ... B29C 64/135; B29C 64/264; B29C 64/124; G03F 7/0037; G03F 7/2053; B33Y 10/00; B33Y 30/00; Y02P 10/25
(Continued)

(56) References Cited

U.S. PATENT DOCUMENTS

| | | | |
|---|---|---|---|
| 2003/0013047 | A1 | 1/2003 | Tani |
| 2005/0012246 | A1 | 1/2005 | Yoshino |

(Continued)

FOREIGN PATENT DOCUMENTS

| | | | |
|---|---|---|---|
| DE | 10111422 | A1 | 9/2002 |
| DE | 102017110241 | A1 | 11/2018 |

(Continued)

OTHER PUBLICATIONS

Office Action dated Mar. 13, 2025, issued in corresponding Chinese Patent Application No. 202180026390.8, with partial English translation (11 pgs.).

(Continued)

*Primary Examiner* — Caleen O Sullivan
(74) *Attorney, Agent, or Firm* — Pillsbury Winthrop Shaw Pittman, LLP

(57) ABSTRACT

In a method for the lithography-based generative manufacturing of a three-dimensional component, in which at least one beam emitted by an electromagnetic radiation source is successively focused by means of an irradiation device onto focal points within a material, as a result of which in each case a volume element of the material located at the focal point is solidified by means of multiphoton absorption, the focal point is displaced in a z-direction, the z-direction corresponding to a direction of irradiation of the at least one beam into the material, the displacement of the focal point in the z-direction being effected by means of at least one acousto-optical deflector arranged in the beam path, in
(Continued)

Figure 1:
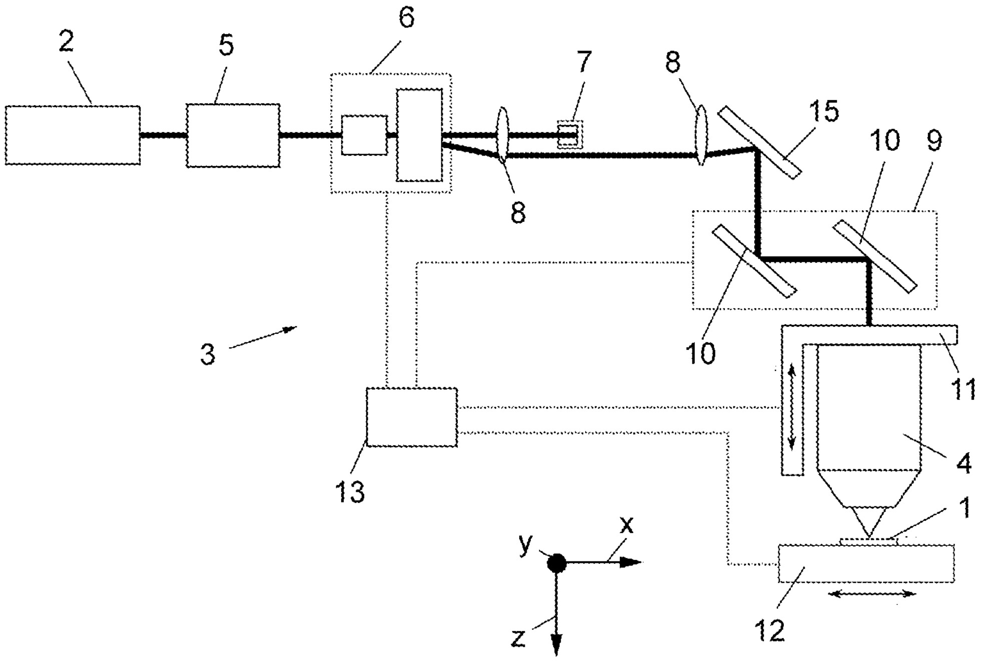

which a sound wave is generated, the frequency of which is periodically modulated.

16 Claims, 2 Drawing Sheets

(51) Int. Cl.
*B33Y 10/00* (2015.01)
*B33Y 30/00* (2015.01)
*G03F 7/00* (2006.01)
*G03F 7/20* (2006.01)

(52) U.S. Cl.
CPC ............ *G03F 7/2053* (2013.01); *B33Y 10/00* (2014.12); *B33Y 30/00* (2014.12)

(58) Field of Classification Search
USPC .......................................................... 430/322
See application file for complete search history.

(56) References Cited

U.S. PATENT DOCUMENTS

| | | | |
|---|---|---|---|
| 2010/0328759 A1 | 12/2010 | Kirkby et al. | |
| 2014/0029081 A1 | 1/2014 | Kirkby et al. | |
| 2014/0376078 A1* | 12/2014 | Shimada ................ | G02B 21/06 359/385 |
| 2019/0255773 A1 | 8/2019 | Ovsianikov et al. | |

FOREIGN PATENT DOCUMENTS

| | | | |
|---|---|---|---|
| JP | 2014-111385 A | 6/2014 |
| KR | 10-2019-0038821 A | 4/2019 |
| WO | 2008/032061 A2 | 3/2008 |
| WO | 2009/075970 A1 | 6/2009 |
| WO | 2018/006108 A1 | 1/2018 |

OTHER PUBLICATIONS

Request for the Submission of an Opinion dated Apr. 8, 2025, issued in corresponding Korean Patent Application No. 10-2022-7038134, with English translation (16 pgs.).

International Search Report dated May 19, 2021 issued in corresponding International Application No. PCT/IB2021/052284, with English translation (3 pgs.).

Warren R. Zipfel et al., "Nonlinear magic: multiphoton microscopy in the biosciences", Nature Biotechnology, vol. 21, No. 11, Nov. 2003, pp. 1369-1377.

Ariel Kaplan et al., "Acousto-optic lens with very fast focus scanning", Optics Letters, vol. 26, No. 14, Jul. 15, 2001, pp. 1078-1080.

International Preliminary Examination Report dated Mar. 3, 2022 issued in corresponding International Application No. PCT/IB2021/052284 (10 pgs.).

* cited by examiner

METHOD AND APPARATUS FOR LITHOGRAPHY-BASED GENERATIVE MANUFACTURING OF A THREE-DIMENSIONAL COMPONENT

CROSS-REFERENCE TO RELATED APPLICATIONS

This is the U.S. National Stage of PCT/IB2021/052284, filed Mar. 18, 2021, which claims priority to European Patent Application No. 20020142.4, filed Mar. 31, 2020, and all contents of each of these applications are incorporated herein by reference in their entireties.

The invention relates to a method for the lithography-based generative manufacturing of a three-dimensional component, in which at least one beam emitted by an electromagnetic radiation source is focused by means of an irradiation device successively onto focal points within a material, whereby in each case a volume element of the material located at the focal point is solidified by means of multiphoton absorption.

The invention further relates to an apparatus for lithography-based generative manufacturing of a three-dimensional component.

A process for forming a component in which the solidification of a photosensitive material is carried out by means of multiphoton absorption has become known, for example, from DE 10111422 A1. For this purpose, a focused laser beam is irradiated into the bath of the photosensitive material, whereby the irradiation conditions for a multiphoton absorption process triggering the solidification are only fulfilled in the immediate vicinity of the focus, so that the focus of the beam is guided to the points to be solidified within the bath volume according to the geometric data of the component to be produced.

At the respective focal point, a volume element of the material is solidified, whereby adjacent volume elements adhere to each other and the component is built up by successive solidification of adjacent volume elements. The component is built up in layers, i.e. volume elements of a first layer are first solidified before volume elements of a next layer are solidified.

Irradiation devices for multiphoton absorption methods include an optical system for focusing a laser beam and a deflection device for deflecting the laser beam. The deflection device is designed to focus the beam successively on focal points within the material which lie in one and the same plane perpendicular to the direction in which the beam enters the material. In an x,y,z coordinate system, this plane is also called the x,y plane. The solidified volume elements created by the beam deflection in the x,y plane form a layer of the component.

To build up the next layer, the relative position of the irradiation device relative to the component is changed in the z-direction, which corresponds to a direction of irradiation of the at least one beam into the material and is perpendicular to the x,y-plane. Due to the mostly motor-driven adjustment of the irradiation device relative to the component, the focal point of the irradiation device is displaced to a new x,y plane, which is spaced in the z direction from the preceding x,y plane by the desired layer thickness.

The described procedure results in that the solidified volume elements can only be generated at predefined positions within a three-dimensional grid. However, on curved surfaces of the component, this results in a stepped configuration, similar to the pixel-like representation of a curved line on a screen. The structuring resolution on the surface of the component depends on the size of the solidified volume elements and on the layer thickness. To increase the structuring resolution, the layer thickness can be reduced; however, this leads to a significant increase in the duration of the build process because the number of layers must be increased.

There have already been various proposals to adjust the size of the solidified volume elements in the edge areas of a component to the desired surface shape in such a way that the deviation of the actual surface from the desired surface is minimized. For example, DE 102017110241 discloses a process in which the irradiation dose for the production of volume elements adjacent to the surface is varied according to a defined pattern. This results in the volume elements written in the edge regions having different extents, contributing to the desired surface structuring. A disadvantage of such a process, however, is that the energy radiated into the material when the irradiation dose is increased can lead to thermal destruction of the material and to the formation of bubbles. Furthermore, the adjustment range is very limited with such a method. The maximum variation of the size of a volume element is less than 20% of the initial size.

Documents US 2003/013047 A1 and US 2014/029081 A1 constitute the general prior art relating to the present subject matter of the invention.

The invention therefore aims to further develop a method and an apparatus for the lithography-based generative manufacturing of a three-dimensional component in such a way that curved and oblique surfaces of the component can be formed with high shape accuracy and the above-mentioned disadvantages can be avoided.

To solve this problem, the invention provides in a method of the type mentioned at the beginning that the focal point is displaced in a z-direction, wherein the z-direction corresponds to a direction of irradiation of the at least one beam into the material, wherein the displacement of the focal point in the z-direction is effected by means of at least one acousto-optical deflector arranged in the beam path, in which a sound wave is generated, the frequency of which is periodically modulated.

By arranging at least one acousto-optical deflector in the beam path of the beam emitted by the radiation source, the focal point can be displaced continuously and at high speed in the z-direction. This allows the position of a volume element to be freely selected in the z-direction and volume elements can therefore also be arranged outside the positions defined by the above-mentioned grid in order to achieve optimum adaptation to the surface shape to be achieved in each case. The displacement of the focal point in the z-direction does not require any mechanical adjustment of the irradiation device relative to the component and is therefore independent of the change from a first to a next layer. In particular, the displacement of the focal point in z-direction is accomplished without moving parts, but solely due to the effect of the aforementioned acousto-optical deflector.

An acousto-optic deflector is an optical component that controls incident light with respect to frequency and propagation direction or intensity. For this purpose, an optical grating is created in a transparent solid with sound waves, at which the light beam is diffracted and simultaneously shifted in its frequency. This causes beam deflection, with the angle of deflection depending on the relative wavelengths of light and ultrasound waves in the transparent solid.

A periodic variation of the frequency of the sound wave generated in the transparent solid forms a so-called "cylindrical lens effect", which focuses the incident light beam in the same way as a cylindrical lens. Specific control of the periodic frequency modulation allows the focal length of the cylindrical lens and thus the divergence of the beam emerging from the acousto-optic deflector to be changed. The beam with the divergence set in this way is guided through an imaging unit of the irradiation device, in which the beam is irradiated into the material in a focused manner by means of a lens. The focal point of the beam introduced into the material varies here in the z-direction as a function of the divergence.

A preferred design here provides that the frequency modulation of the sound wave has a constant sound wave frequency gradient. This favors the creation of the so-called "cylindrical lens effect". If, on the other hand, the sound wave frequency does not change linearly, wavefront errors occur.

Preferably, it is further provided that the focal point is displaced by a change in the (constant) sound wave frequency gradient of the frequency modulation. The change of the sound wave frequency gradient can be achieved, for example, by changing the bandwidth of the frequency modulation while keeping the period duration of the periodic modulation constant. Alternatively, the bandwidth can be kept constant and the change of the sound wave frequency gradient can be caused by a change of the period duration.

The fundamental frequency of the sound wave is preferably 50 MHz or more for a transparent solid made of e.g. $TeO_2$, in particular >100 MHz, especially 100-150 MHz. For example, the fundamental frequency is modulated by at least ±10%, preferably ±20-30%. In the case of a fundamental frequency of, for example, 110 MHz, this is periodically modulated by ±25 MHz, i.e. the bandwidth of the frequency modulation is 50 MHz and the frequency of the sound wave is therefore periodically modulated between 85 MHz and 135 MHz. As already mentioned, the change of the sound wave frequency gradient determines the focal length of the cylindrical lens, whereby the modulation frequency is preferably at least 100 kHz, in particular 0.1-10 MHz.

Preferably, at least two acousto-optic deflectors are used one after the other in the beam path, the at least two acousto-optic deflectors preferably having a direction of beam deflection which is substantially perpendicular to one another or having the same orientation of beam deflection. The combination of two acousto-optic deflectors, preferably arranged directly perpendicularly behind each other, eliminates the astigmatism that otherwise occurs with a single deflector. When two acousto-optical deflectors are arranged in one plane, the possible displacement path of the focal point in the z-direction is doubled. According to another preferred embodiment, four acousto-optic deflectors may be provided in series, of which the first two deflectors form a first pair and the subsequent two deflectors form a second pair. The deflectors within a pair are each configured with the same orientation of the beam deflection, and the deflectors of the first pair have a direction of the beam deflection that is perpendicular with respect to the deflectors of the second pair.

As known per se, the focal point is preferably also displaced in an x-y plane extending transversely to the z-direction, the displacement in the x-y plane being effected by means of a deflection unit different from the at least one acousto-optical deflector. The deflection unit is advantageously arranged in the beam path between the at least one acousto-optical deflector and the imaging unit. The deflection unit can be designed as a galvanometer scanner, for example. For two-dimensional beam deflection, either a mirror can be deflected in two directions or two orthogonally pivotable mirrors can be set up close to each other, by which the beam is reflected. The two mirrors can each be driven by a galvanometer drive or electric motor.

Preferably, the component is built up in layers with layers extending in the x-y plane, the change from one layer to a next layer comprising the change of the relative position of the irradiation device relative to the component in the z-direction. By mechanically adjusting the relative position of the irradiation device relative to the component, the coarse adjustment of the focal point in the z-direction, namely the change from one layer to the next, takes place. For the adjustment of intermediate steps in the z-direction, i.e. for the fine positioning of the focus point in the z-direction, however, the focus point is positionally changed by means of the acousto-optical deflector.

Preferably, the focal point can be displaced in the z-direction by means of the acousto-optical deflector within the thickness of a layer. Several layers of volume elements arranged one above the other in the z-direction can also be produced within a layer without having to mechanically adjust the relative position of the irradiation device relative to the component.

According to a preferred application of the invention, the focal point is displaced in the z-direction by means of the acousto-optic deflector to form a curved outer contour of the component. Alternatively or additionally, the focal point can be displaced in the z-direction by means of the acousto-optical deflector to form an outer contour of the component that is oblique relative to the x,y-plane. The displacement of the focal point in the z-direction can follow the surface shape by positioning the focal point in the edge area of the component at a distance from the surface of the component to be produced which corresponds to the distance of the imaginary center of the volume element to be solidified to the outer surface of the volume element.

According to a preferred method the material is present on a material support, such as in a trough, and the irradiation of the material is carried out from below through the material support, which is permeable to the radiation at least in some areas. In this case, a build platform can be positioned at a distance from the material carrier and the component can be built up on the build platform by solidifying material located between the build platform and the material carrier. Alternatively, it is also possible to irradiate the material from above.

Structuring a suitable material using multiphoton absorption offers the advantage of exceedingly high structure resolution, with volume elements with minimum structure sizes of up to 50 nm×50 nm×50 nm being achievable. However, due to the small focal point volume, the throughput of such a method is very low, since, for example, for a volume of 1 $mm^3$, a total of more than $10^9$ points must be irradiated. This leads to very long construction times, which is the main reason for the low industrial use of multiphoton absorption processes.

In order to increase the component throughput without losing the possibility of high structure resolution, a preferred further development of the invention provides that the volume of the focal point is varied at least once during the build-up of the component, so that the component is built up from solidified volume elements of different volumes.

Due to the variable volume of the focal point, high resolutions are possible (with a small focal point volume). At the same time, a high writing speed (measured in $mm^3/h$) is achievable (with a large focal point volume). Thus, by varying the focal point volume, high resolution can be combined with high throughput. The variation of the focal point volume can be used, for example, in such a way that a large focal point volume is used in the interior of the component to be built up in order to increase the throughput, and a smaller focal point volume is used on the surface of the component in order to form the component surface with high resolution. Increasing the focal point volume allows for higher structuring throughput, since the volume of material solidified in one irradiation instance is increased. To maintain high resolution at high throughput, small focal point volumes can be used for finer structures and surfaces, and larger focal point volumes can be used for coarse structures and/or to fill interior spaces. Methods and devices for changing the focal point volume are described in WO 2018/006108 A1.

In the context of the present invention, the construction time can be considerably reduced if the layers located in the interior of the component are built up with a high layer thickness and therefore with volume elements having a large volume and the edge areas are built up from volume elements having a smaller volume and, in the edge areas, the position of the volume elements is additionally individually adjusted along the z-direction in order to obtain a high structural resolution at the surface.

In a preferred method, the variation of the focal volume is such that the volume ratio between the largest focal point volume during the production of a component and the smallest focal point volume is at least 2, preferably at least 5.

The principle of multiphoton absorption is used in the context of the invention to initiate a photochemical process in the photosensitive material bath. Multiphoton absorption methods include, for example, 2-photon absorption methods. As a result of the photochemical reaction, there is a change in the material to at least one other state, typically resulting in photopolymerization. The principle of multiphoton absorption is based on the fact that the aforementioned photochemical process takes place only in those areas of the beam path where there is sufficient photon density for multiphoton absorption. The highest photon density occurs at the focal point of the optical imaging system, so multiphoton absorption is sufficiently likely to occur only at the focal point. Outside the focal point, the photon density is lower, so the probability of multiphoton absorption outside the focal point is too low to cause an irreversible change in the material by a photochemical reaction. The electromagnetic radiation can pass through the material largely unhindered in the wavelength used, and only at the focal point does an interaction occur between photosensitive material and electromagnetic radiation. The principle of multiphoton absorption is described, for example, in Zipfel et al, "*Nonlinear magic: multiphoton microscopy in the biosciences*," NATURE BIOTECHNOLOGY VOLUME 21 NUMBER 11 Nov. 2003.

The source of the electromagnetic radiation may preferably be a collimated laser beam. The laser can emit one or more, fixed or variable wavelengths. In particular, it is a continuous or pulsed laser with pulse lengths in the nanosecond, picosecond or femtosecond range. A pulsed femtosecond laser offers the advantage that a lower average power is required for multiphoton absorption.

Photosensitive material is defined as any material that is flowable or solid under building conditions and that changes to a second state by multiphoton absorption in the focal point volume—for example, by polymerization. The material change must be limited to the focal point volume and its immediate surroundings. The change in substance properties may be permanent and consist, for example, in a change from a liquid to a solid state, but it may also be temporary. Incidentally, a permanent change can also be reversible or non-reversible. The change in material properties does not necessarily have to be a complete transition from one state to the other, but can also be present as a mixed form of both states.

The power of the electromagnetic radiation and the exposure time influence the quality of the produced component. By adjusting the radiation power and/or the exposure time, the volume of the focal point can be varied within a narrow range. If the radiation power is too high, additional processes occur that can lead to damage of the component. If the radiation power is too low, no permanent material property change can occur. For each photosensitive material, there are therefore typical construction process parameters that are associated with good component properties.

Preferably, it is provided that the change of the focal point volume takes place in at least one, preferably two, in particular three, spatial directions perpendicular to each other.

According to a second aspect of the invention, there is provided an apparatus for lithography-based generative manufacturing of a three-dimensional component, in particular for carrying out a method according to the first aspect of the invention, comprising a material support for a solidifiable material and an irradiation device which can be controlled for the location-selective irradiation of the solidifiable material with at least one beam, wherein the irradiation device comprises an optical deflection unit, in order to focus the at least one beam successively onto focal points within the material, whereby in each case a volume element of the material located at the focal point can be solidified by means of multiphoton absorption, characterized in that the irradiation device comprises at least one acousto-optical deflector which is arranged in the beam path of the beam and is designed to displace the focal point in a z-direction, the z-direction corresponding to an irradiation direction of the at least one beam into the material.

Preferably, the control unit of the at least one acousto-optic deflector comprises a frequency generator configured to periodically modulate the ultrasonic frequency.

Preferably, it is provided here that the frequency generator is designed to change the sound wave frequency gradient.

As already mentioned in connection with the method according to the invention, it is advantageous if at least two acousto-optical deflectors are arranged one behind the other in the beam path, wherein the at least two acousto-optical deflectors preferably have a direction of beam deflection extending substantially perpendicular to one another or an identical orientation of beam deflection.

Furthermore, the deflection unit is preferably designed to displace the focal point in an x-y plane extending transversely to the z-direction.

In particular, the irradiation device may be configured to build up the component layer-by-layer with layers extending in the x-y plane, wherein the change from one layer to a next layer comprises changing the relative position of the irradiation device relative to the component in the z-direction.

The irradiation device is preferably designed in such a way that the displacement of the focal point in the z-direction by means of the acousto-optical deflector takes place within the thickness of a layer.

Furthermore, it can be provided that the material is present on a material carrier, such as in a trough, and the irradiation of the material is carried out from below through the material carrier, which is permeable to the radiation at least in certain areas.

The build platform is preferably positioned at a distance from the material support and the component is built up on the build platform by solidifying solid elements located between the build platform and the material support.

It is advantageous if the volume of the focal point is varied at least once during the construction of the component, so that the component is constructed from solidified volume elements of different volumes.

The invention is explained in more detail below with reference to schematic examples of embodiments shown in the drawing. Therein, FIG. 1 shows a schematic representation of a device according to the invention, FIG. 2 a modified embodiment of the device according to FIG. 1, and FIG. 3 a schematic representation of the arrangement of volume elements in the edge region of a component.

In FIG. 1, a substrate or carrier is denoted with 1, on which a component is to be built. The substrate is arranged in a material vat, not shown, which is filled with a photopolymerizable material. A laser beam emitted from a radiation source 2 is successively focused into the material by an irradiation device 3 at focal points within the photopolymerizable material, thereby solidifying a volume element of the material located at each focal point by multiphoton absorption. For this purpose, the irradiation device includes an imaging unit comprising a lens 4 that introduces the laser beam into the material within a writing area.

The laser beam first enters a pulse compressor 5 from the radiation source 2 and is then passed through at least one acousto-optic deflector module 6, whose two acousto-optic deflectors split the beam into a zero-order beam and a first-order beam. The zero-order beam is collected in a beam trap 7. The acousto-optic deflector module 6 comprises two acousto-optic deflectors arranged one behind the other, the direction of beam deflection of which is perpendicular to each other. With regard to the deflected beam of first order, the acousto-optic deflector module 6 acts in each case as a cylindrical lens with an adjustable focal length, so that the first-order beam has an adjustable divergence. The beam of first order is now guided via relay lenses 8 and a deflection mirror 15 into a deflection unit 9, in which the beam is reflected successively by two mirrors 10.

The mirrors 10 are driven to pivot about axes of rotation that are orthogonal to each other, so that the beam can be deflected in both the x and y axes. The two mirrors 10 can each be driven by a galvanometer drive or electric motor. The beam exiting the deflection unit 9 preferably enters the objective via a relay lens system, not shown, which focuses the beam into the photopolymerizable material as mentioned above.

To build up the component layer by layer, volume elements of one layer after the other are solidified in the material. To build up a first layer, the laser beam is successively focused on focal points located in the focal plane of the objective 4 within the material. The deflection of the beam in the x,y plane is performed here with the aid of the deflection unit 9, whereby the writing area is limited by the objective 4. For the change to the next plane, the objective 4 attached to a carrier 11 is displaced in the z-direction relative to the substrate 1 by the layer distance, which corresponds to the layer thickness. Alternatively, the substrate 1 can be displaced relative to the fixed objective 4.

If the component to be produced is larger in the x and/or y direction than the writing area of the objective 4, partial structures of the component are built up next to each other (so-called stitching). For this purpose, the substrate 1 is arranged on a x-y-stage 12, which can be moved in the x and/or y direction relative to the irradiation device 3.

Furthermore, a control unit 13 is provided which controls the at least one acousto-optical deflector 6, the deflection device 9, the carrier 11 and the x-y-stage 12.

The acousto-optic deflector 6 forms a cylindrical lens effect that depends on the sound wave frequency gradient of the frequency modulation. The equivalent focal length of the cylindrical lens $F_l$ can be calculated as follows:

$$F_l = \frac{v_a^2}{\lambda \frac{dF_a}{dt}}$$

where $v_a$ is the acoustic propagation velocity in the crystal, λ is the wavelength of the laser beam, and $dF_a/d_t$ is the acoustic wave frequency gradient in the crystal. In $TeO_2$ with a propagation speed of 4200 m/s at a laser wavelength of 780 nm and traversing a bandwidth of ±25 MHz (e.g., starting from a fundamental excitation frequency of 110 MHz) within 0.2 μs, the focal length of the acousto-optic cylindrical lens is 90 mm. For an objective 4 with a focal length of 9 mm and a 20× expansion, this results in a new focal length of the entire system of $$F_{total} = \frac{F_{Obj} F_l}{F_{Obj} + F_l}$$

which corresponds to a displacement in the z-direction, depending on the sign of the gradient, of ±90 μm for the parameters mentioned above. By changing the sound wave frequency gradient, the z-position of the volume element can be adjusted linearly and continuously.

Figure 3:
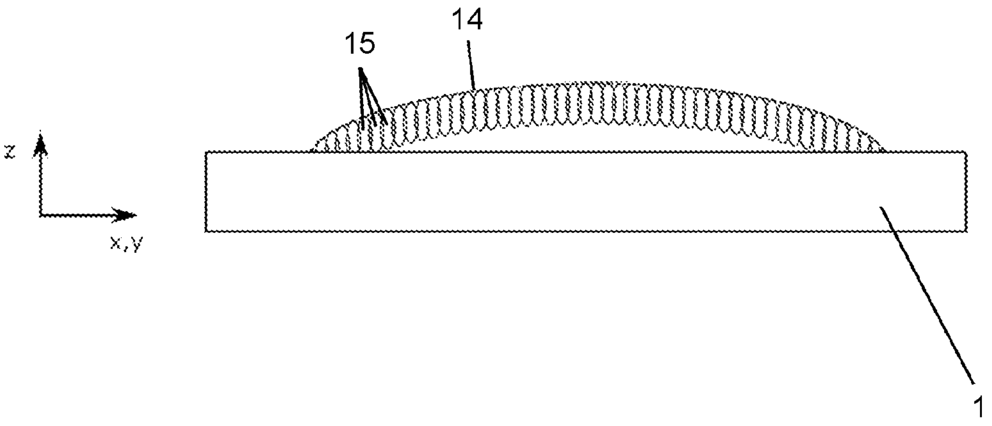

According to the invention, the described possibility for a continuous displacement of the focal point in the z-direction can be exploited to optimally approximate an inclined or curved surface, as shown schematically in FIG. 3. In FIG. 3, the individual volume elements are labeled 15 and the curved surface of the component is labeled 14. It can be seen that the z-position of the volume elements 15 follows the surface shape, although the size of the individual volume elements 15 can remain the same.

Figure 2:
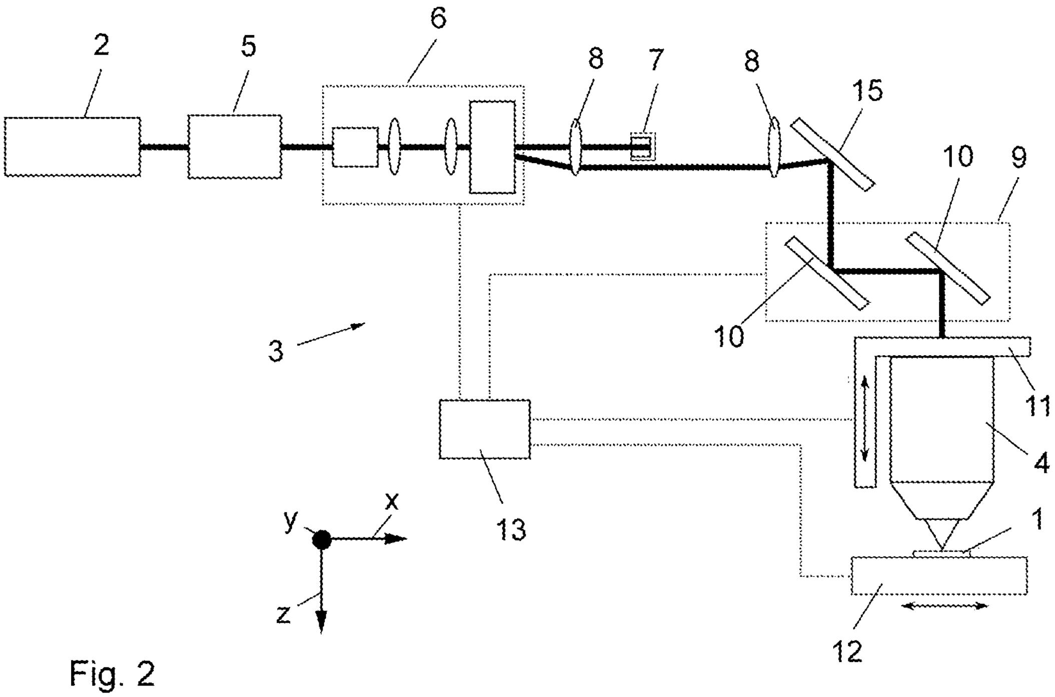

FIG. 2 shows a modified embodiment of the device according to FIG. 1, in which the acousto-optical deflector module 6, in contrast to FIG. 1, has two acousto-optical deflectors between which relay lenses are arranged to ensure that the focus point at the input and output of the acousto-optical deflector module 6 are arranged on the same line.

The invention claimed is:

1. A method for lithography-based generative manufacturing of a three-dimensional component, in which at least one beam emitted by an electromagnetic radiation source is successively focused by means of an irradiation device onto focal points within a material, as a result of which in each case a volume element of the material located at each focal point is solidified by means of multiphoton absorption, characterized in that at least one of said focal points is displaced in a z-direction, the z-direction corresponding to a direction of irradiation of the at least one beam into the material, the displacement of said at least one focal point in the z-direction being effected by means of at least one acousto-optical deflector arranged in a beam path of the at least one beam, in which a sound wave is generated, a frequency of which is periodically modulated.

2. The method according to claim 1, characterized in that the at least one focal point is displaced by changing a sound wave frequency gradient of the frequency modulation.

3. The method according to claim 1, characterized in that at least two acousto-optical deflectors are used one behind the other in the beam path.

4. The method according to claim 3, wherein the at least two acousto-optical deflectors have either a direction of beam deflection which is substantially perpendicular to one another or have a same orientation of beam deflection.

5. The method according to claim 1, characterized in that the at least one focal point is displaced in an x-y plane extending transversely to the z-direction, the displacement in the x-y plane being effected by means of a deflection unit different from the at least one acousto-optical deflector.

6. The method according to claim 1, characterized in that the three-dimensional component is built up layer by layer with layers extending in the x-y plane, a change from one layer to a next layer comprising changing a relative position of the irradiation device relative to the three-dimensional component in the z-direction.

7. The method according to claim 6, characterized in that the displacement of the at least one focal point in the z-direction by means of the at least one acousto-optical deflector takes place within a layer thickness of a layer.

8. The method according to claim 1, characterized in that the at least one focal point is displaced in the z-direction by means of the at least one acousto-optical deflector in order to form a curved outer contour or an outer contour of the three-dimensional component which is oblique relative to the x-y plane, a size of each of the volume elements forming the outer contour.

9. An apparatus for the lithography-based generative manufacturing of a three-dimensional component using the method according to claim 1, the apparatus comprising a material carrier for a solidifiable material and the irradiation device which can be controlled for position-selective irradiation of the solidifiable material with the at least one beam, the irradiation device comprising an optical deflection unit, in order to focus the at least one beam successively onto focal points within the material, whereby in each case a volume element of the material located at least one of said focal points can be solidified by means of multiphoton absorption, characterized in that the irradiation device comprises at least one acousto-optical deflector which is arranged in the beam path of the at least one beam and is designed to displace the at least one focal point in a z-direction, the z-direction corresponding to an irradiation direction of the at least one beam into the material.

10. The apparatus according to claim 9, characterized in that the at least one acousto-optic deflector comprises a frequency generator adapted to periodically modulate sound wave frequency.

11. The apparatus according to claim 10, characterized in that the frequency generator is adapted to vary a gradient of the sound wave frequency.

12. The apparatus according to claim 8, characterized in that at least two acousto-optical deflectors are arranged one behind the other in the beam path.

13. The apparatus according to claim 12, wherein the at least two acousto-optical deflectors have either a direction of beam deflection extending substantially perpendicular to one another or have a same orientation of beam deflection.

14. The apparatus according to claim 9, characterized in that the optical deflection unit is designed to displace the at least one focal point in an x-y plane extending transversely to the z-direction.

15. The apparatus according to claim 9, characterized in that the irradiation device is adapted to build up the three-dimensional component layer by layer with layers extending in the x-y plane, a change from one layer to a next layer comprising changing a relative position of the irradiation device relative to the three-dimensional component in the z-direction.

16. The apparatus according to claim 9, characterized in that the irradiation device is designed in such a way that the displacement of the at least one focal point in the z-direction by means of the acousto-optical deflector takes place within a layer thickness of a layer.

* * * * *